(12) United States Patent
Chen et al.

(10) Patent No.: US 11,404,474 B2
(45) Date of Patent: Aug. 2, 2022

(54) LIGHT-EMITTING DEVICE AND MANUFACTURING METHOD THEREOF

(71) Applicant: EPISTAR CORPORATION, Hsinchu (TW)

(72) Inventors: Cheng-Yu Chen, Hsinchu (TW); Hui-Chun Yeh, Hsinchu (TW); Chien-Fu Shen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 152 days.

(21) Appl. No.: 17/006,459

(22) Filed: Aug. 28, 2020

(65) Prior Publication Data

US 2021/0066390 A1    Mar. 4, 2021

(30) Foreign Application Priority Data

Aug. 30, 2019 (TW) ................................. 108131271

(51) Int. Cl.
*H01L 27/15* (2006.01)
*H01L 33/38* (2010.01)

(52) U.S. Cl.
CPC ............ *H01L 27/156* (2013.01); *H01L 33/38* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,165,977 B2* | 10/2015 | Kim | ..................... | H01L 27/156 |
| 9,673,254 B2* | 6/2017 | Oh | ..................... | H01L 27/156 |
| 10,043,961 B2* | 8/2018 | Yeh | ..................... | H01L 33/62 |
| 10,879,438 B2* | 12/2020 | Abe | ..................... | H01L 33/56 |
| 2018/0233630 A1* | 8/2018 | Jing | ..................... | H01L 33/382 |

\* cited by examiner

*Primary Examiner* — Mark W Tornow
*Assistant Examiner* — Priya M Rampersaud
(74) *Attorney, Agent, or Firm* — Ditthavong, Steiner & Mlotkowski

(57) ABSTRACT

A light-emitting device, includes: a substrate, comprising a top surface; a first edge and a second edge opposite to the first edge; a plurality of light-emitting units arranged in N rows on the substrate, wherein the N rows comprises a first row at the first edge and a $N^{th}$ row at the second edge; and a plurality of connection electrodes, formed on and electrically connecting the plurality of light-emitting units; wherein the plurality of light-emitting units comprises a first light-emitting unit in the first row, and the first light-emitting unit comprises a first notch on the first edge wherein the first notch comprises a bottom composed by the top surface.

20 Claims, 18 Drawing Sheets

LIGHT-EMITTING DEVICE AND MANUFACTURING METHOD THEREOF

CROSS-REFERENCE TO RELATED APPLICATIONS

This application claims priority to the benefit of Taiwan Patent Application Number 108131271 filed on Aug. 30, 2019, and the entire contents of which are hereby incorporated by reference herein in its entirety.

BACKGROUND

Technical Field

The present disclosure relates to a light-emitting device, more specifically, to a light-emitting device having a plurality of light-emitting units.

Description of the Related Art

The light-emitting diodes (LEDs) of solid-state lighting device have the characteristics of low power consumption, low heat-generation, long lifetime, compact size, high response speed, and nice optical and electrical characteristics such as stable emission wavelength. Thus, the LEDs have been widely using in household appliance, lighting device, indicating lamp, optical device and the like. As the optical technique develops, solid-state lighting devices have great improvements in light-emitting efficiency, lifetime, and brightness.

A conventional LED includes a substrate, an n-type semiconductor layer, an active region, a p-type semiconductor layer formed on the substrate, and a p-electrode and a n-electrode respectively formed on the p-type and n-type semiconductor layers. By applying a certain forward voltage on the LED via the electrodes, holes from the p-type semiconductor layer and electrons from the n-type semiconductor layer are combined in the active region so as to emit light.

A high-voltage LED is a single LED chip which is divided into a plurality of light-emitting units electrically connected in series on one substrate. Compared with the conventional LED, the high-voltage LED can be operated at low current and high voltage and has a large output power with the same chip size. The number and the size of the light-emitting units of the high-voltage LED can be determined in accordance with an input voltage, and each light-emitting unit can be optimized. The high-voltage LED has advantages of high voltage operation, small size, and flexibility of package design and optical design.

SUMMARY

A light-emitting device, includes: a substrate, comprising a top surface; a first edge and a second edge opposite to the first edge; a plurality of light-emitting units arranged in N rows on the substrate, wherein the N rows comprises a first row at the first edge and a $N^{th}$ row at the second edge; and a plurality of connection electrodes, formed on and electrically connecting the plurality of light-emitting units; wherein the plurality of light-emitting units comprises a first light-emitting unit in the first row, and the first light-emitting unit comprises a first notch on the first edge wherein the first notch comprises a bottom composed by the top surface.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1A:
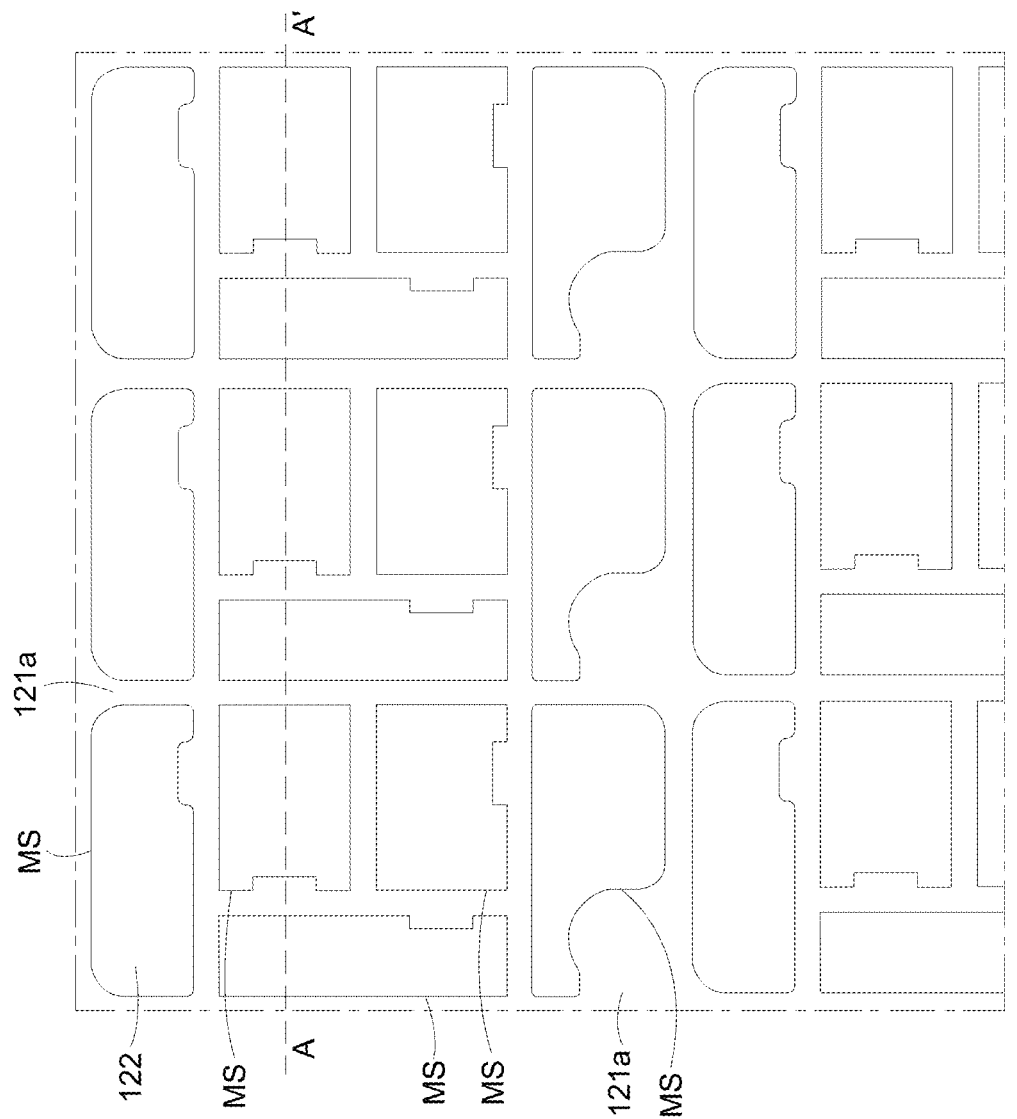
FIGS. 1A to 1E show top views of a manufacturing method of a light-emitting device 1 in accordance with an embodiment of the present application.
Figure 1A:
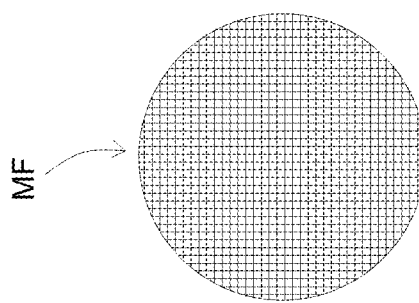
Figure 2A:
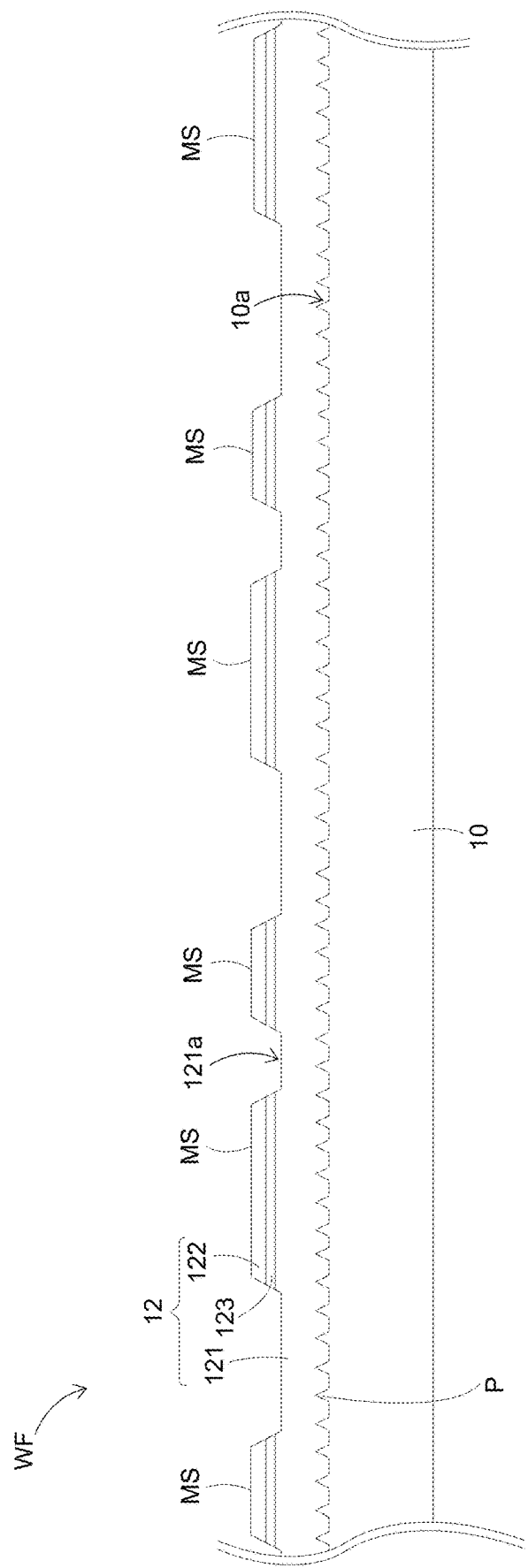
FIGS. 2A to 2F show cross-sectional views of the manufacturing method of the light-emitting device 1 in accordance with the embodiment of the present application.
Figure 2B:
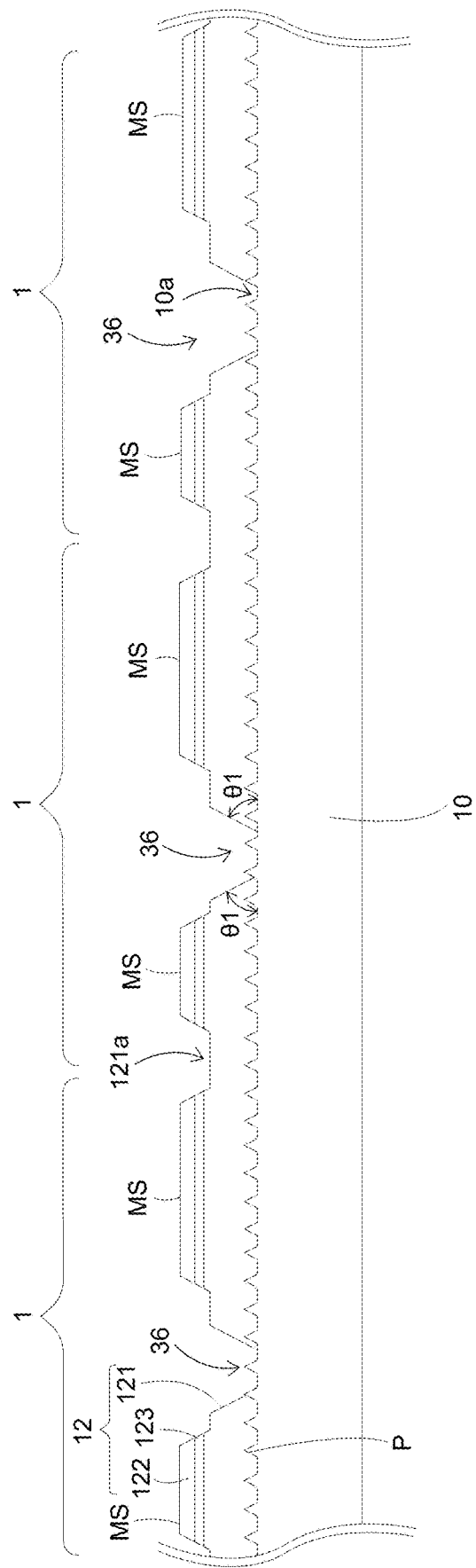
Figure 2C:
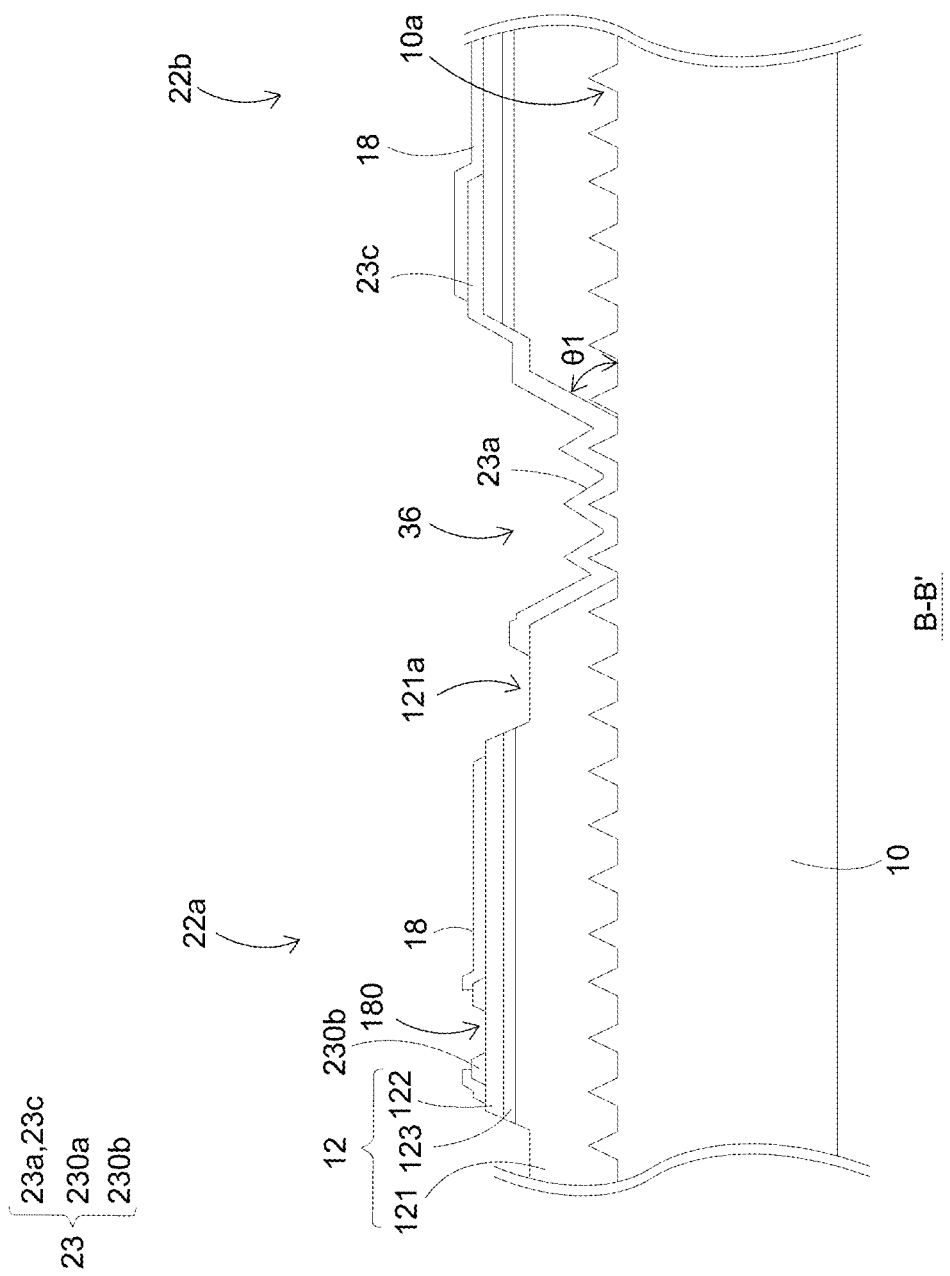
Figure 2D:
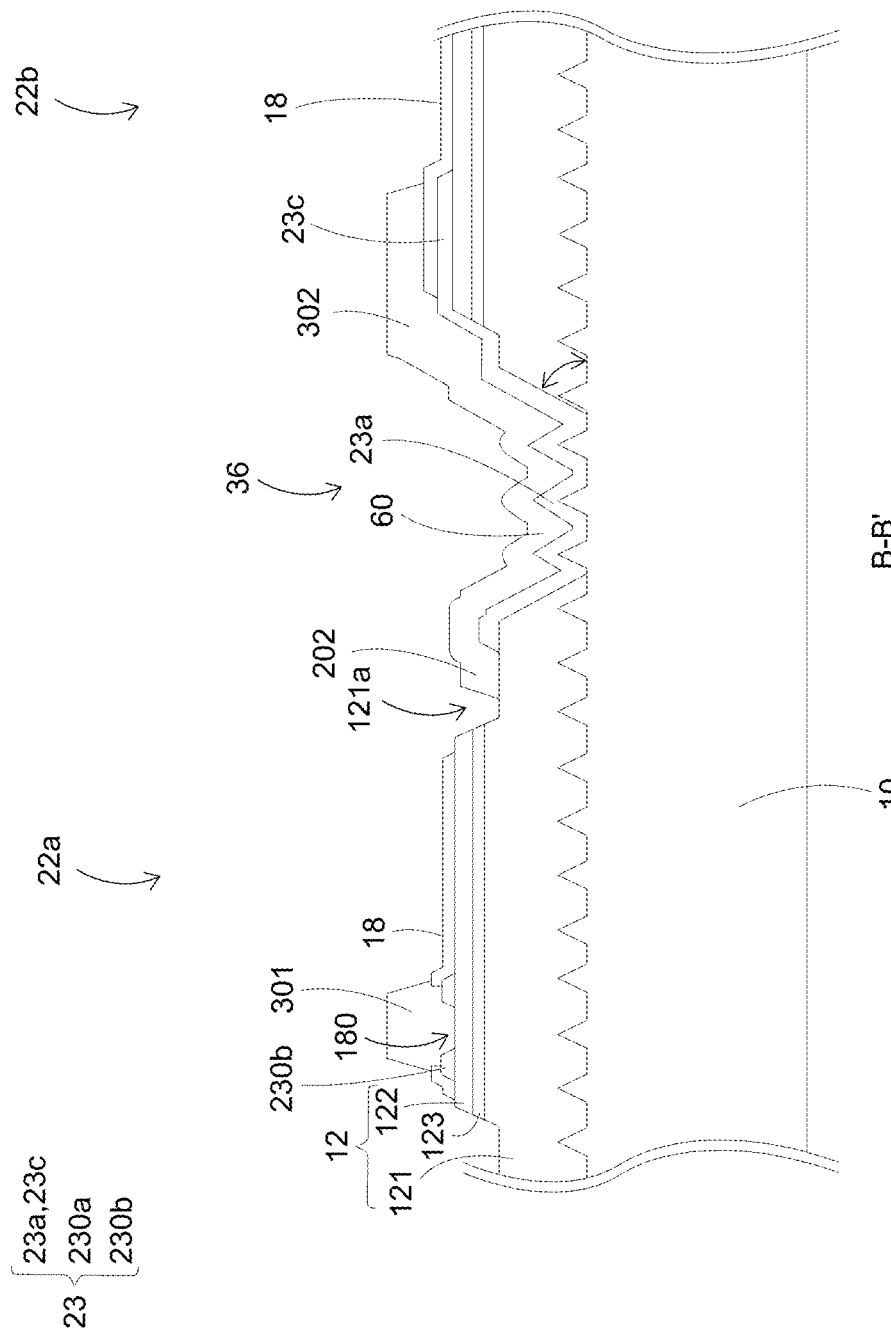
Figure 2E:
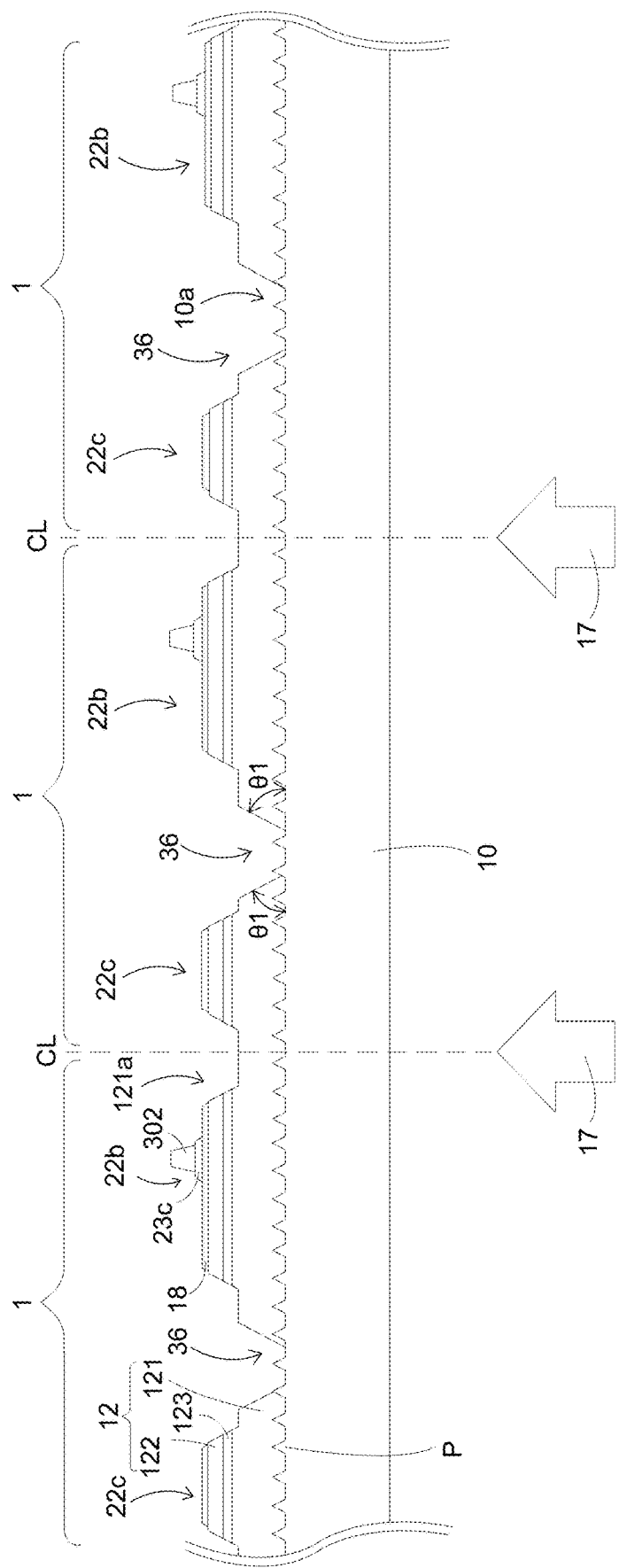
Figure 2F:
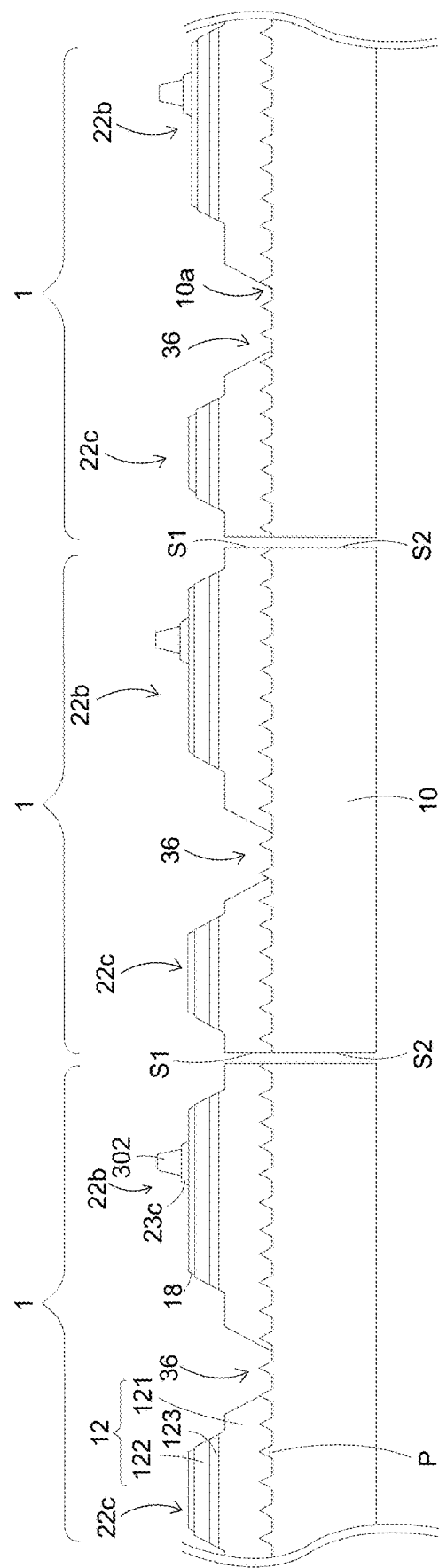
Figure 3:
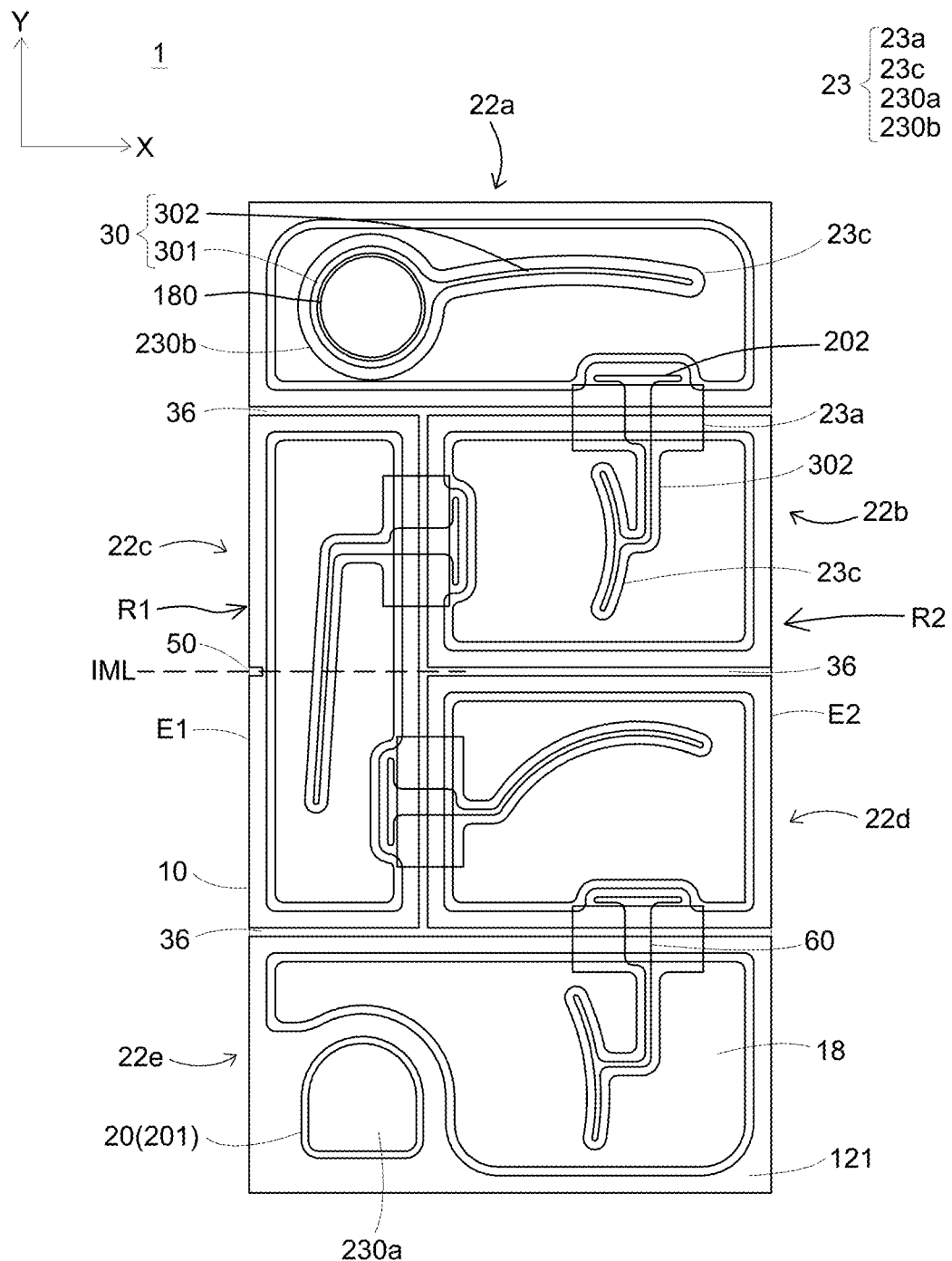
FIG. 3 shows a top view of the light-emitting device 1.

FIG. 3 shows a top view of a light-emitting device 1 in accordance with an embodiment of the present application. FIGS. 1A to 1E show partial top views of the light-emitting device 1 in each step of the manufacturing method in accordance with an embodiment of the present application. FIGS. 2A-2F show the corresponding cross-sectional views in each step of the manufacturing method. As shown in FIG. 3, the light-emitting device 1 includes a plurality of light-emitting units 22 (22a-22e) formed on a substrate 10. The plurality of light-emitting units 22 are separated by trenches 36 and electrically connected to each other by connection electrodes 60 to form a light-emitting unit array. In the top view of FIG. 3, the light-emitting device 1 includes a first edge E1 and a second edge E2 opposite to the first edge E1. In an embodiment, the first edge E1 and the second edge E2 are two opposite edges of the substrate 10. In the present embodiment, the light-emitting units 22a-22e are arranged into two light-emitting unit rows R1 and R2 (hereinafter referred to as the first row and the second row). The light-emitting unit 22c is located in the first row R1, the light-emitting units 22b and 22d are located in the second row R2, and the start light-emitting unit 22a and the end light-emitting unit 22e are laterally disposed across the first row R1 and the second row R2. The light-emitting units 22a, 22c and 22e are provided along the first edge E1, and the light-emitting units 22a, 22b, 22d and 22e are provided along the second edge E2. In the light-emitting device 1, the arrangement of the light-emitting units 22 on the first edge E1 and the second edge E2 are different. Each of the light-emitting units 22a-22e includes a transparent conductive layer 18, a first electrode 20 (201, 202), a second electrode 30 (301, 302), and a current blocking layer 23. The light-emitting unit 22c includes a notch 50 on the first edge E1.

In one embodiment, the manufacturing method of the light-emitting device 1 is described in detail below. FIG. 2A is a cross-sectional view taken along the A-A' line in FIG. 1A. Referring to FIGS. 1A and 2A, a semiconductor stack and mesas are formed. First, the semiconductor stack 12 is formed on the substrate 10. In the present embodiment, the substrate in the manufacturing method and the substrate of the light-emitting device are labeled by the same number. The substrate 10 and the semiconductor stack 12 formed thereon constitute a semiconductor wafer WF. FIG. 1A shows a semiconductor wafer WF and a partially enlarged view thereof.

The substrate 10 can be a growth substrate for growing AlGaInP semiconductor thereon, such as GaAs substrate or GaP substrate. The substrate 10 can be a growth substrate for growing InGaN or AlGaN thereon, such as sapphire substrate, GaN substrate, SiC substrate, or AlN substrate. The substrate 10 includes a top surface 10a. The substrate 10 can be a patterned substrate, that is, the substrate 10 includes a plurality of patterned structures P on the top surface 10a. Light emitted from the semiconductor stack 12 can be refracted by the plurality of patterned structures P, thereby increasing the brightness of the light-emitting device. In addition, the plurality of patterned structures P lessens or inhibits the dislocation due to lattice mismatch between the substrate 10 and the semiconductor stack 12, thereby improving the epitaxial quality of the semiconductor stack 12.

In an embodiment of the present application, the semiconductor stack 12 is formed on the substrate 10 by epitaxy such as metal-organic chemical vapor deposition (MOCVD), hydride vapor epitaxy (HVPE), or physical vapor deposition such as molecular beam epitaxy (MBE), sputtering or evaporating.

The semiconductor stack 12 includes a buffer structure (not shown), a first semiconductor layer 121, an active region 123, and a second semiconductor layer 122 sequentially formed on the substrate 10. The buffer structure can reduce the lattice mismatch and suppress dislocation, thereby improving the epitaxial quality. The material of the buffer structure includes GaN, AlGaN, or AlN. In an embodiment, the buffer structure includes a plurality of sub-layers (not shown). The sub-layers include the same material or different materials. In one embodiment, the buffer structure includes two sub-layers, wherein a first sub-layer thereof is grown by sputtering and a second sub-layer thereof is grown by MOCVD. In another embodiment, the buffer structure further includes a third sub-layer. The third sub-layer is grown by MOCVD and the growth temperature of the second sub-layer is higher or lower than the growth temperature of the third sub-layer. In an embodiment, the first, the second, and the third sub-layers include the same material, such as AlN. In an embodiment, the first semiconductor layer 121 and the second semiconductor layer 122 are, for example, a cladding layer or a confinement layer. The first semiconductor layer 121 and the second semiconductor layer 122 have different conductivity types, different electrical properties, different polarities, or different dopants for providing electrons or holes. For example, the first semiconductor layer 121 is an n-type semiconductor and the second semiconductor layer 122 is a p-type semiconductor. The active region 123 is formed between the first semiconductor layer 121 and the second semiconductor layer 122. Driven by a current, electrons and holes are combined in the active region 123 to convert electrical energy into optical energy for illumination. The wavelength of the light emitted by the light-emitting device 1 or the semiconductor stack 12 can be adjusted by changing the physical properties and chemical composition of one or more layers in the semiconductor stack 12.

The material of the semiconductor stack 12 includes III-V semiconductor like $Al_xIn_yGa_{(1-x-y)}N$ or $Al_xIn_yGa_{(1-x-y)}P$, where $0 \leq x$, $y \leq 1$; $x+y \leq 1$. When the material of the active region of the semiconductor stack 12 includes AlInGaP, the semiconductor stack 12 emits red light having a wavelength between 610 nm and 650 nm or yellow light having a wavelength between 550 nm and 570 nm. When the material of the active region of the semiconductor stack 12 includes InGaN, the semiconductor stack 12 emits blue light or deep blue light having a wavelength between 400 nm and 490 nm or green light having a wavelength between 490 nm and 550 nm. When the material of the active region of the semiconductor stack 12 includes AlGaN, the semiconductor stack 12 emits UV light having a wavelength between 250 nm and 400 nm. The active region 123 can be a single hetero-structure (SH), a double hetero-structure (DH), a double-side double hetero-structure (DDH), or a multi-quantum well (MQW) structure. The material of the active region 123 can be i-type, p-type, or n-type.

Next, the mesas are formed. Portions of the semiconductor stack 12 are removed to expose an upper surface 121a of the first semiconductor layer 121 thereby forming the plurality of mesas MS. The top surface of the mesa MS is the top surface of the second semiconductor layer 122. In a top view, the upper surface 121a surrounds each mesas MS. In the present embodiment, each mesa MS corresponds to each light-emitting unit 22. The method for removing the semiconductor stack 12 includes etching.

Figure 1B:
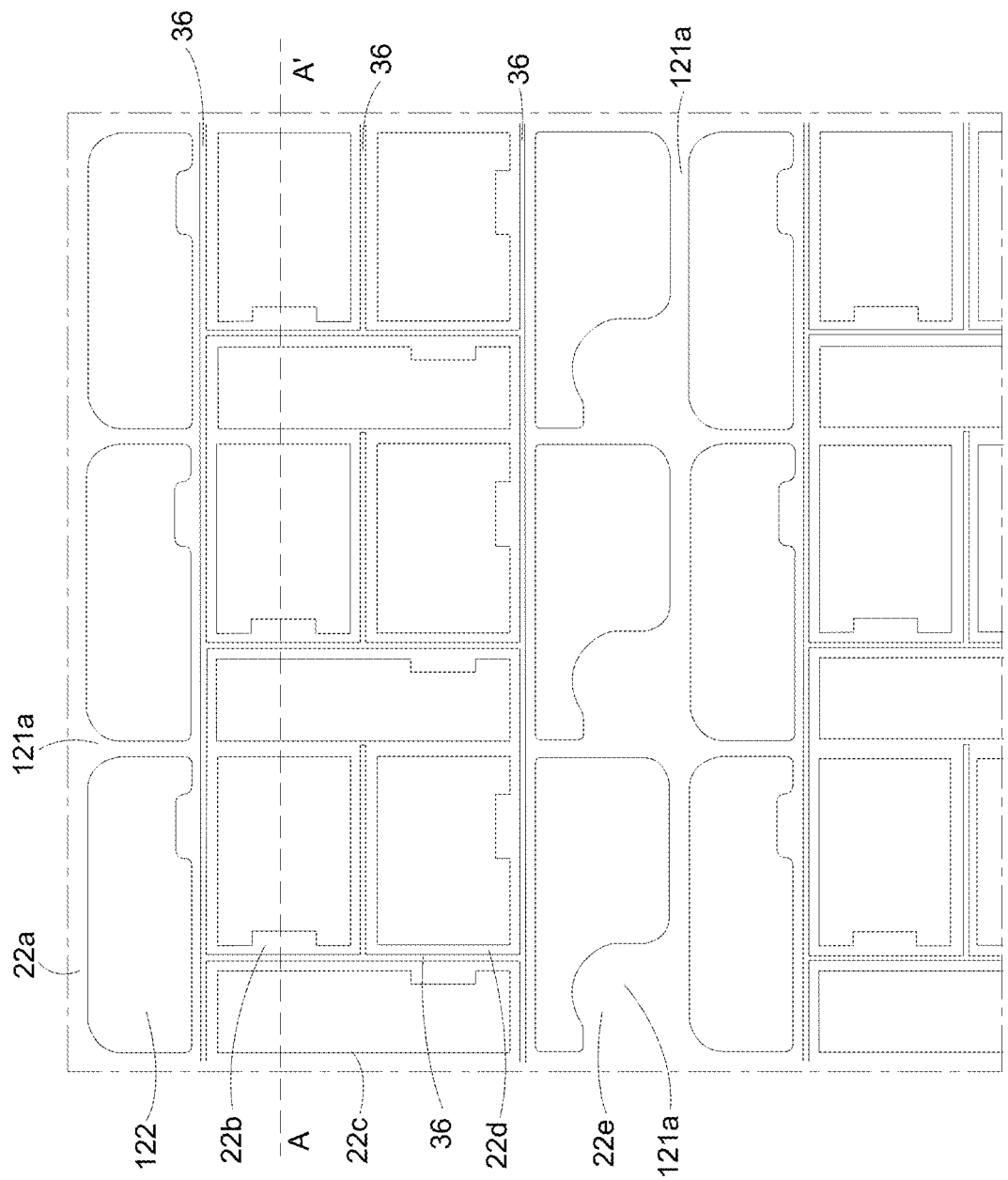

Next, referring to FIG. 1B and FIG. 2B, a step of forming trenches is performed. FIG. 2B is a cross-sectional view taken along the A-A' line in FIG. 1B. In this step, portions of the first semiconductor layer 121 is removed from the upper surface 121a of the first semiconductor layer to form the trench 36. The trench 36 separates the semiconductor stack 12 in each light-emitting device 1 and defines a plurality of light-emitting units 22 (22a-22e). The side wall of the trench 36 is the side wall of the semiconductor stacks 12 of two adjacent light-emitting units 22, and the bottom of the trench 36 is composed by the exposed top surface 10a of the substrate 10. The included angle between the side wall of the trench 36 and the top surface 10a of the substrate 10 is $\theta 1$, and $\theta 1$ is less than 90 degrees. In an embodiment, $\theta 1$ is between 20-80 degrees. In the semiconductor wafer, the first semiconductor layer 121 between adjacent light-emitting devices 1 is connected; that is, the adjacent light-emitting devices 1 are not isolated by the trench 36. The boundary between the adjacent light-emitting devices 1, which is used as a pre-defined dicing line (not shown) in the subsequent dicing process, is located on the upper surface 121a of the connected first semiconductor layer 121.

Figure 1C:
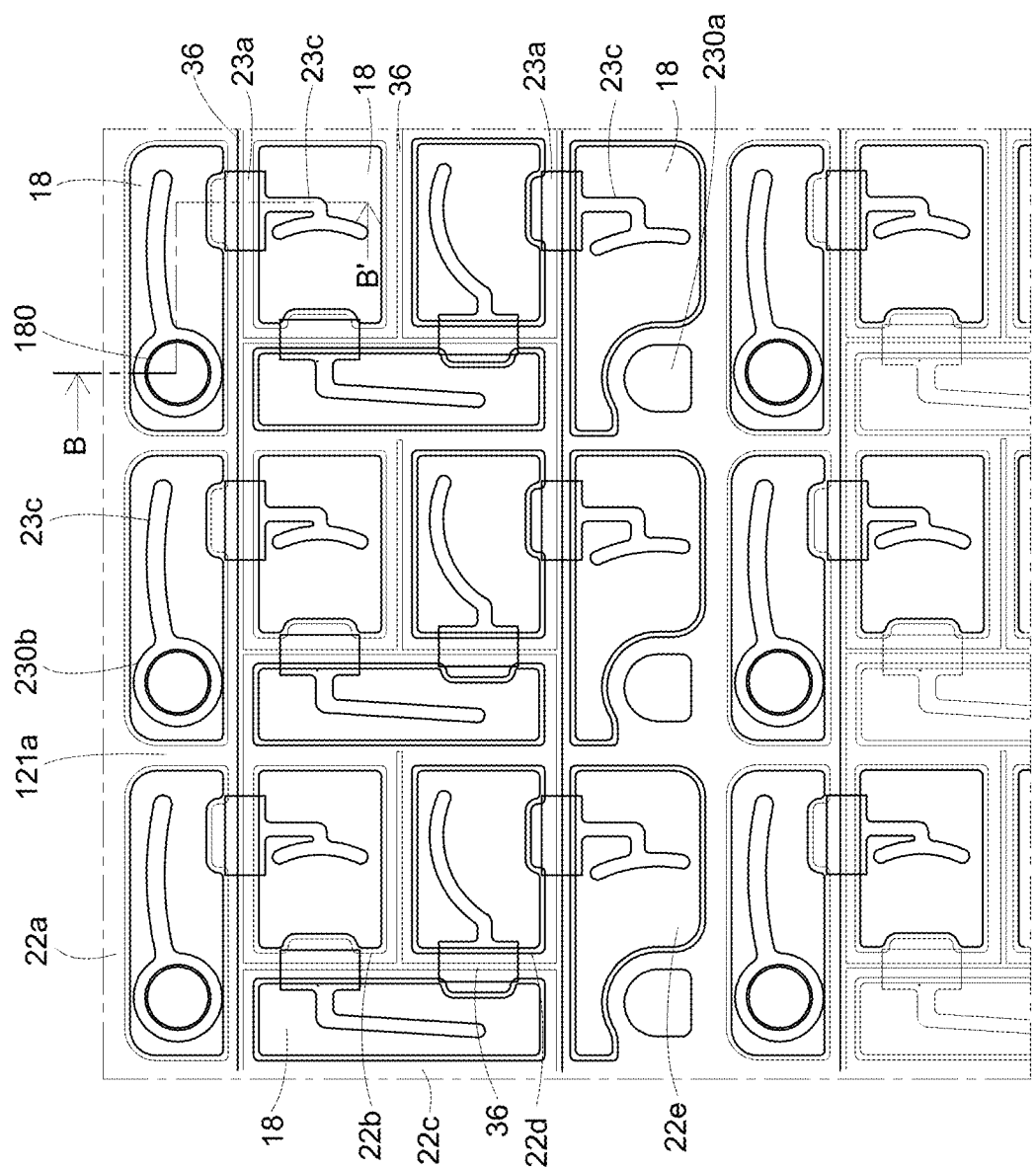

Next, referring to FIGS. 1C and 2C, a current blocking layer and a transparent conductive layer are formed. FIG. 2C is a cross-sectional view taken along the B-B' line in FIG. 1C.

First, an insulating layer (not shown) is formed on each light-emitting unit 22 and in the trench 36 to cover the trench 36. Then, the insulating layer is patterned by processes such as photolithography and etching to form the current blocking layer 23. In the embodiment, the current blocking layer 23 includes a first current blocking portion 230a, a second current blocking portion 230b, an intermediate portion 23a, and an extending portion 23c. The first current blocking portion 230a is formed on the first semiconductor layer 121 of the end light emitting unit 22e in the light-emitting unit array, the second current block portion 230b is formed on the second semiconductor layer 122 of the starting light-emitting unit 22a in the light-emitting unit array, the intermediate portion 23a is formed on the trench 36 and the extending portion 23c is formed on the second semiconductor 122. In one embodiment as shown in FIG. 2C, the intermediate portion 23a covers the bottom of the trench 36 and the side wall of the semiconductor stack 12. The extending portions 23c extend from the intermediate portions 23a and are formed on the upper surfaces of the second semiconductor layers 122 in the light-emitting units 22b, 22c, 22d and 22e. In another embodiment, the current blocking layer 23 does not include the first current blocking portion 230a.

The material of the current blocking layer 23 includes transparent insulating material, such as silicon oxide, silicon nitride, silicon oxynitride, titanium oxide, aluminum oxide, a combination or a stack of the above materials. The current blocking layer 23 can be a single layer or a stack of multiple layers. In one embodiment, the current blocking layer 23 includes a stack of single pair or multiple pairs of insulating layers. Each pair of the insulating layers includes two sub-layers with different refractive indexes. The current blocking layer 23 includes a distributed Bragg reflector (DBR).

In one embodiment, the second current blocking portion 230b includes an opening that exposes the upper surface of the second semiconductor layer 122 of the light-emitting unit 22a. In one embodiment, the first light-emitting unit 22e does not have the first current blocking portion 230a on the first semiconductor layer 121.

Next, a transparent conductive layer 18 is formed to cover the upper surface of the second semiconductor layer 122 of each light-emitting unit 22 and electrically contact the second semiconductor layer 122. In the embodiment, the transparent conductive layer 18 covers the extending portion 23c of the current blocking layer 23 and the second current blocking portion 230b. The transparent conductive layer 18 can be a metal or a transparent conductive material. The metal is selected from a thin metal layer with light transmittance. The transparent conductive material is transparent to the light emitted from the active region 123 and includes indium tin oxide (ITO), aluminum zinc oxide (AZO), gallium zinc oxide (GZO), indium zinc oxide (IZO) or other suitable materials. In one embodiment, the transparent conductive layer 18 includes an opening 180 corresponding the opening of the second current blocking portion 230b.

Figure 1D:
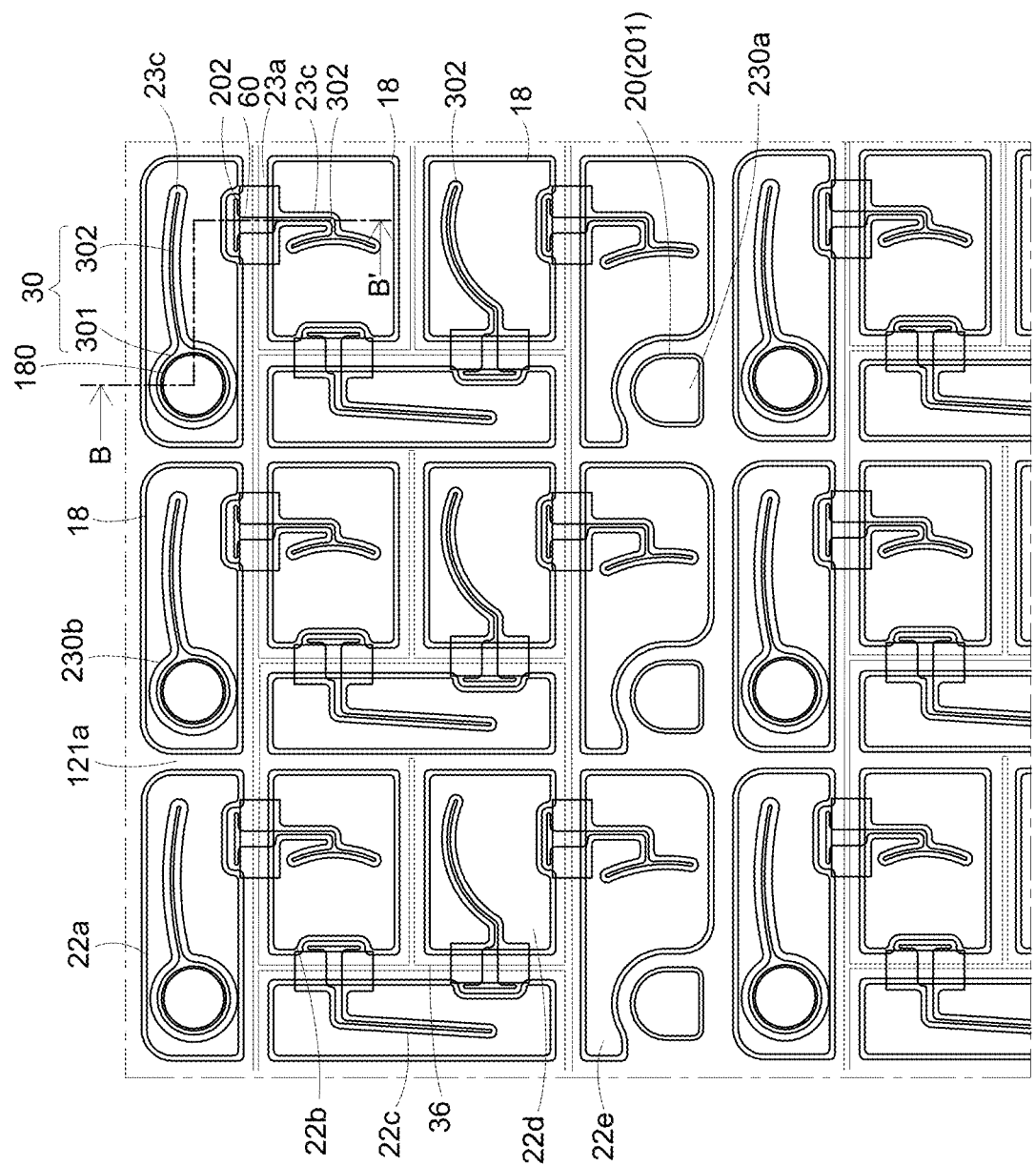

Next, referring to FIGS. 1D and 2D, a conductive structure is formed. FIG. 2D is a cross-sectional view taken along the B-B' line in FIG. 1D.

The conductive structure is formed on the light emitting unit 22 and the trench 36. The conductive structure includes a first electrode 20 and a second electrode 30 on the light-emitting units 22, and a connection electrode 60 formed between two adjacent light-emitting units 22. The material of the conductive structure includes metal such as Cr, Ti, Au, Al, Cu, Sn, Ni, Rh, Pt, an alloy or a stack of the above materials.

On the light-emitting unit 22e, the first electrode 20 is formed on the first semiconductor layer 121 and includes the first pad electrode 201. In other embodiments, the first electrode 20 further includes a first extending electrode 202 extending from the first pad electrode 201. The first electrode 20 is electrically connected to the first semiconductor layer 121 and is located on the first current blocking portion 230a. In a top view, the area of the first pad electrode 201 is larger than the area of the first current blocking portion 230a, and the first pad electrode 201 covers the upper surface and the side wall of the first current blocking portion 230a. In another embodiment, the area of the first pad electrode 201 is smaller than the area of the first current blocking portion 230a. On each of the other light-emitting units, the first extending electrodes 202 are electrically connected to the first semiconductor layers 121. On the light-emitting unit 22a, the second electrode 30 is formed on the transparent conductive layer 18 and is electrically connected to the transparent conductive layer 18 and the second semiconductor layer 122, including a second pad electrode 301 and a second extending electrodes 302 extending from the second pad electrode 301. On each of the other light-emitting units, the second extending electrodes 302 are also electrically connected to the second semiconductor layers 122. In this embodiment, the position of the second pad electrode 301 corresponds to the opening of the second current blocking portion 230b and the opening 180 of the transparent conductive layer 18. The second pad electrode 301 contacts the second semiconductor layer 122 through these openings. In another embodiment, the second pad electrode 301 is located in the opening 180 of the transparent conductive layer 18 and does not contact the transparent conductive layer 18. The second pad electrode 301 is formed on the second current blocking portion 230b and extends into the opening of the second current blocking portion 230b to contact the second semiconductor layer 122. The connection electrode 60 is formed on the intermediate portion 23a of the current blocking layer 23, and connects the first extending electrode 202 on one light-emitting unit and the second extending electrode 302 on the adjacent light-emitting unit, so that the light-emitting units 22 form a series-connected light-emitting unit array.

In another embodiment, the connection electrode 60 connects the first extending electrodes 202 on two adjacent light-emitting units 22, and/or the connection electrode 60 connects the second extending electrodes 302 on two adjacent light-emitting units 22, so that the light-emitting units 22 form different types of light-emitting unit array such as parallel connection, series connection or series-parallel connection.

The second pad electrode 301 on the light-emitting unit 22a and the first pad electrode 201 on the light-emitting unit 22e are used for wire bonding so that the light-emitting device 1 electrically connects to an external electronic component or a power source. In another embodiment, a first fan-out pad and a second fan-out pad (not shown) are formed on the light-emitting device and electrically connect to the first pad electrode 201 and the second pad electrode 301, respectively. The light-emitting device with the fan-out pads can be flipped and mounted on a carrier (not shown), or directly and electrically connects to an external electronic component or a power source. The first current blocking portion 230a and the second current blocking portion 230b can block current from directly injecting into the semiconductor stack 12 through the pad electrodes, and to push current to spread through the first electrode 20, the second electrode 30 and the transparent conductive layer 18. The extending portion 23c of the current blocking layer 23 is disposed along and under the second extending electrode 302. Similarly, due to the extending portion 23c, the current spreads in the transparent conductive layer 18 on the current blocking layer 23 rather than directly flows into the semiconductor stack 12 through the second extending electrode 302. Therefore, the current blocking layer 23 is helpful for uniform current spreading.

In FIGS. 1A to 1E, FIGS. 2A to 2F, and FIG. 3, although not all the elements on all the light-emitting units 22 are labeled, people having ordinary skill in the art can understand the structure of each light-emitting unit 22 and the elements thereon by the above description and drawings.

Figure 1E:
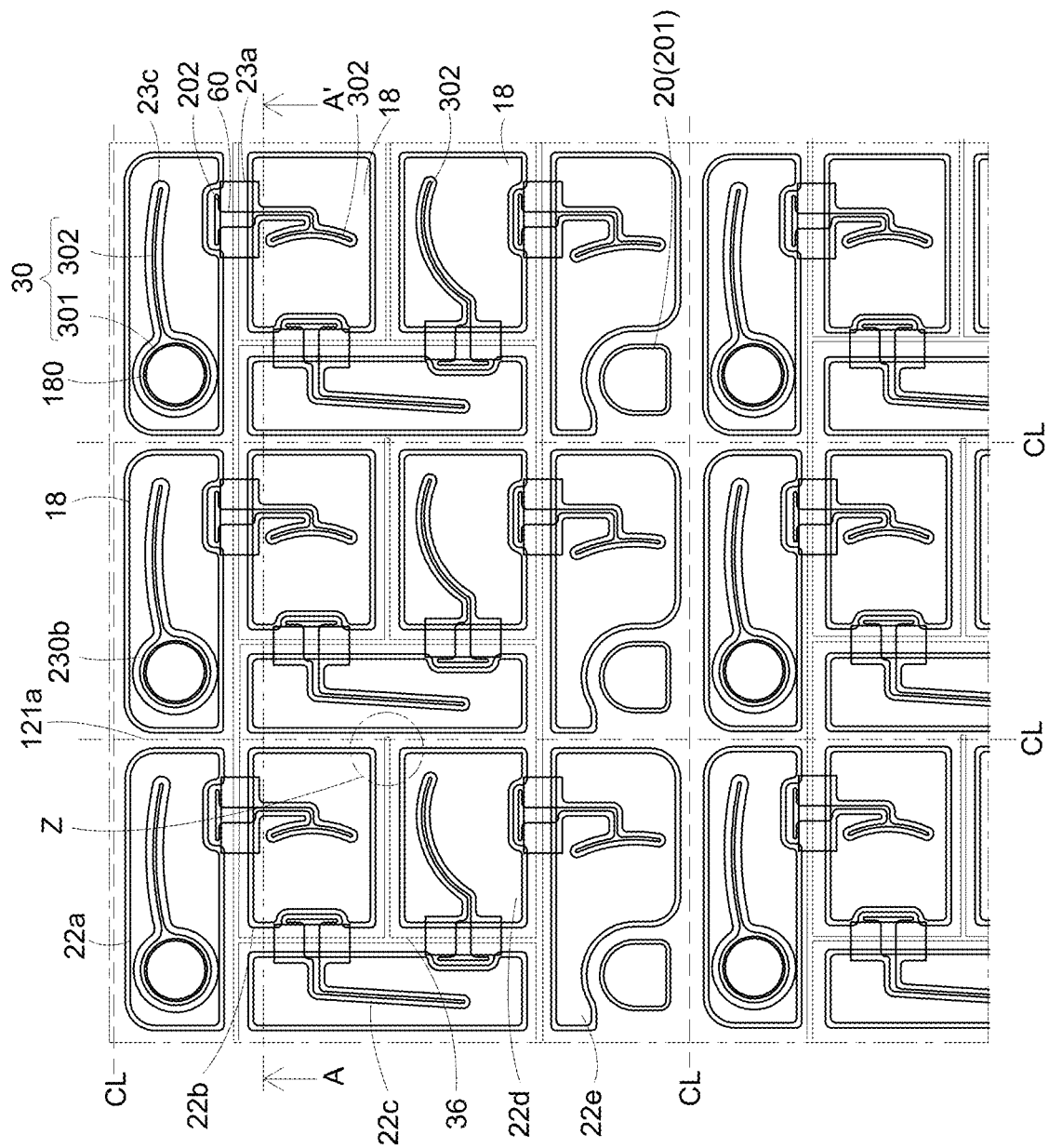
Figure 4A:
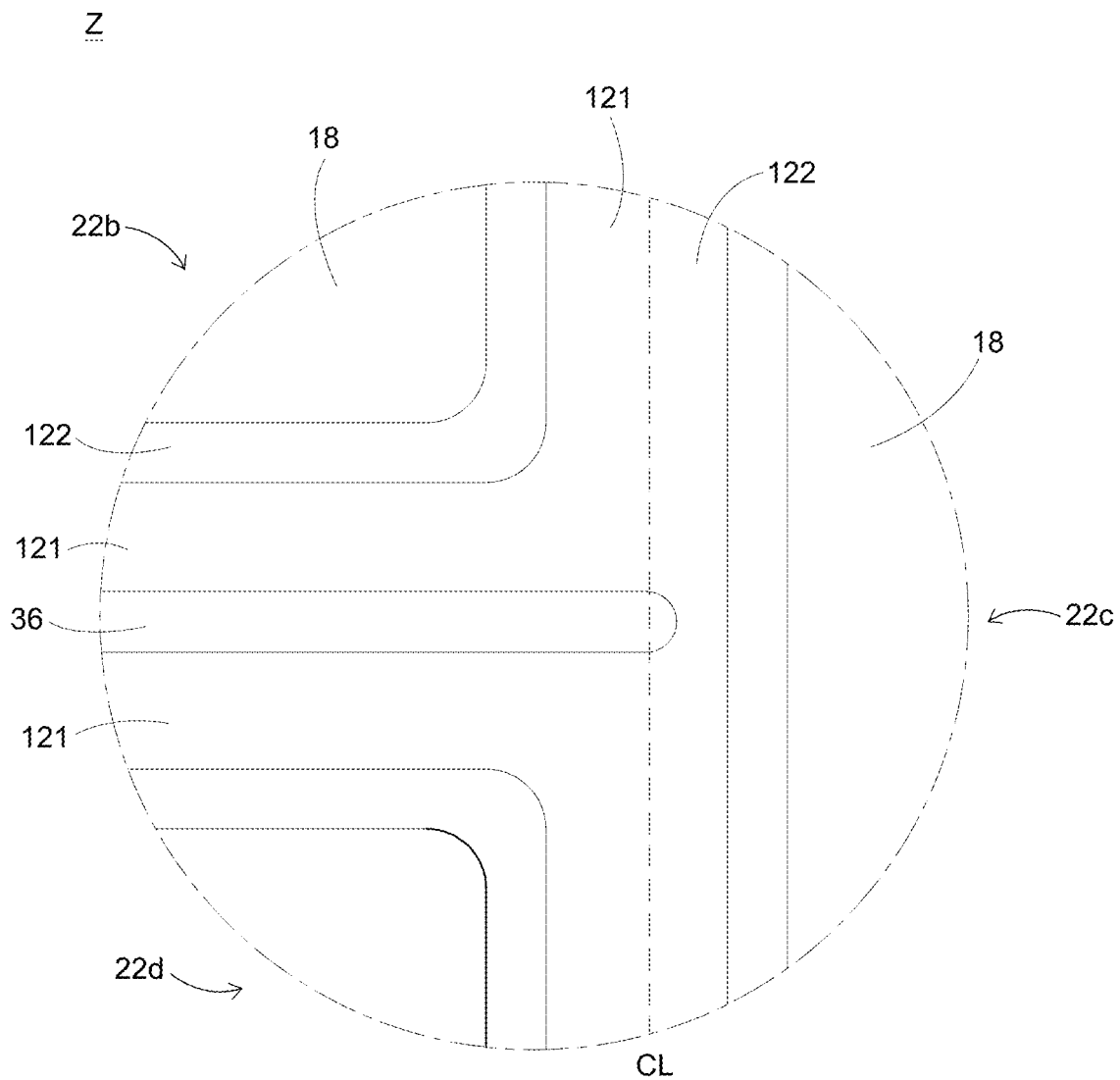
FIG. 4A shows a partial enlarged view of FIG. 1E.

Next, referring to FIGS. 1E and 2E, a dicing step is performed. FIG. 2E is a cross-sectional view taken along the A-A' line in FIG. 1E. FIG. 4A is a partially enlarged view of the area Z in FIG. 1E. In one embodiment, a laser 17 is irradiated from the back of the substrate 10 corresponding to the pre-defined dicing line, and a modified region (not shown) is formed inside the substrate 10, and then cracks are formed along the crystal plane of the substrate from the modified region. The semiconductor wafer is diced to form a plurality of light-emitting devices 1 along the dicing line CL. Each light-emitting device 1 includes a plurality of light-emitting units 22 (22a-22e) electrically connected with each other. FIG. 2F shows that the plurality of light-emitting devices 1 are formed after the dicing step has been completed in FIG. 2E. The side walls S1 of the first semiconductor layer 121 at the periphery of each light-emitting device 1 are connected to the side walls S2 of the substrate thereunder. In one embodiment, the side walls S1 of the first semiconductor layer 121 at the periphery of each light-emitting device 1 are connected to and coplanar with the side walls S2 of the substrate thereunder. In one embodiment, the included angle between the side wall S1 of the first semiconductor layer 121 and the top surface 10a of the substrate 10 is greater than 80 degrees. In one embodiment, the sidewall S1 of the first semiconductor layer 121 is substantially perpendicular to the top surface 10a of the substrate 10.

Figure 4B:
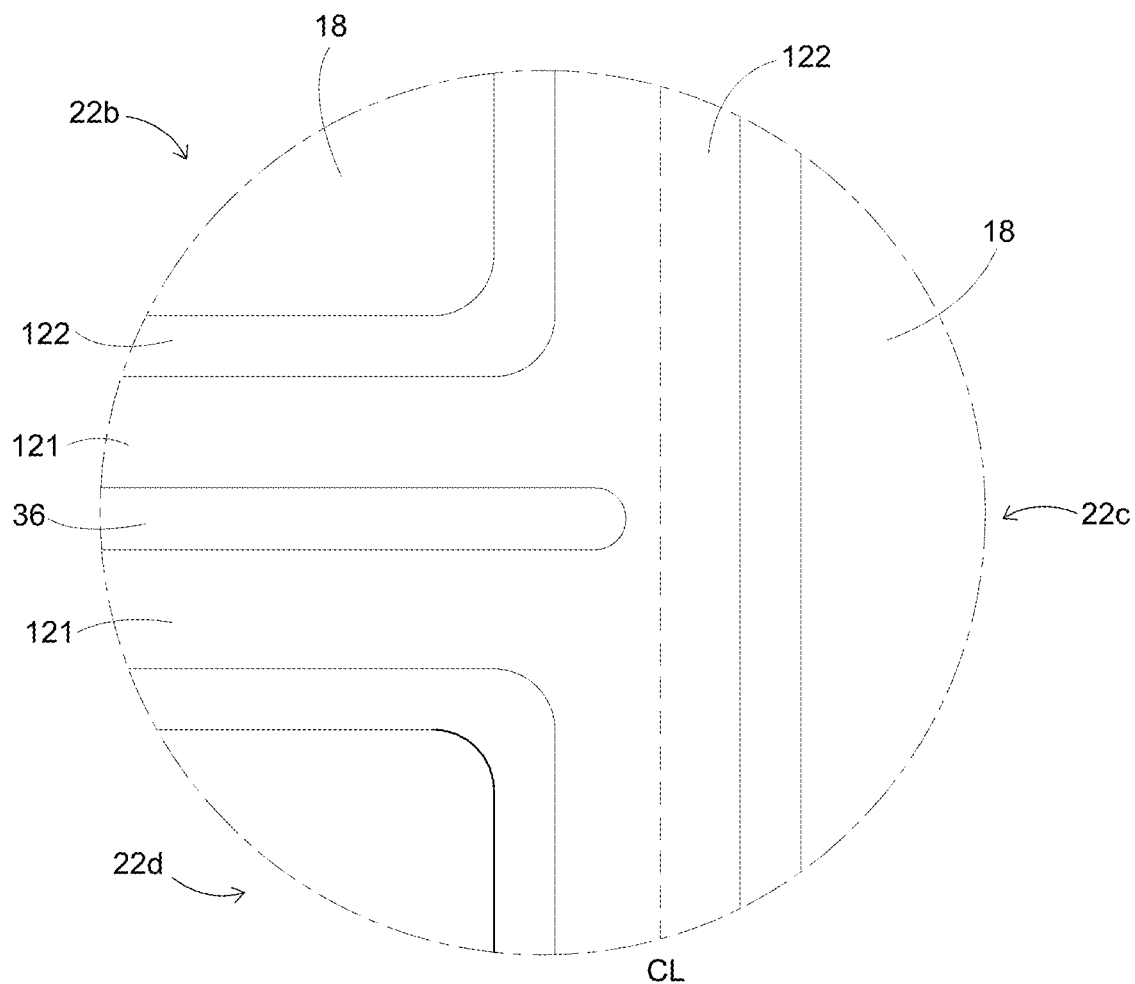
FIG. 4B shows a partial enlarged top view of a manufacturing method of a light-emitting device in accordance with a comparative example.

In a conventional method for manufacturing a light-emitting device having a plurality of light-emitting units, in the step of forming trenches to define the plurality of light-emitting units, the light-emitting devices are also defined and separated from each other on the substrate by the trenches; that is, the trenches around each light-emitting device is used as the pre-defined dicing line. In the manufacturing method of the light-emitting device 1 of the present embodiment, there is no trench formed for dicing line between adjacent light-emitting devices 1. The first semiconductor layers 121 between the adjacent light-emitting devices 1 are reserved and connected, as shown in FIG. 2E. During the subsequent dicing process, the connected first semiconductor layers 121 are then separated to form the plurality of individual light-emitting devices 1, as shown in FIG. 2F. In this manner, the trenches are not formed between two adjacent light-emitting devices to be the pre-defined dicing line. Because the arrangement of the light-emitting devices in the semiconductor wafer can be denser, more light-emitting devices can be formed within a unit area of the semiconductor wafer. In addition, the first semiconductor layers 121 between the adjacent light-emitting devices 1 are reserved and the pre-defined dicing line are located on the upper surface of the connected first semiconductor layers 121 so less semiconductor stack is wasted during the manufacturing process and more light emitting area is retained. Thus, compared with the comparative example, the light-emitting devices 1 formed by the manufacturing method in accordance with the present embodiment has larger area of the semiconductor stack at the same area of the substrate, and the light-emitting devices 1 has higher brightness. In one embodiment, during the manufacturing process shown in FIG. 1D and FIG. 1E, the light-emitting units 22b and 22d of one light-emitting device 1 are adjacent to and connected to the light-emitting unit 22c of the other light-emitting device 1. In the manufacturing process, if the width and position of the trench and/or the dicing line are not precisely controlled, it may cause the result as shown in the comparative example of FIG. 4B. The trench 36 between the light-emitting units 22b and 22d and the dicing line CL are not intersected. Thus, a part of the first semiconductor layer 121 is still connected between the light-emitting units 22b and 22d. After the individual light-emitting device is formed in accordance with the comparative example shown in FIG. 4B, short circuit occurs between the light-emitting units 22b and 22d due to the connection of the part of the first semiconductor layer 121 and the light-emitting device does not work. Therefore, referring to FIG. 1E and FIG. 4A of the present embodiment, the trench 36 formed between the light-emitting units 22b and 22d is extended to the first semiconductor layer 122 of the light-emitting unit 22c of the adjacent light-emitting device 1. It can be ensured that in the subsequent dicing process, the light-emitting units 22b and 22d can be separately formed on the substrate 10 by the trench 36 through the extension of the trench 36 and the dicing line CL.

Since the trench 36 between the light-emitting units 22b and 22d extends to the light-emitting unit 22c of the adjacent light-emitting device 1 in the manufacturing process, in one embodiment as shown in FIG. 3 that the individual light-emitting device 1 is formed, the first semiconducting layer 121 of the light-emitting unit 22c includes a notch 50 on the first edge E1. The position of the notch 50 is on an imaginary extending line IML of the trench 36 between the light-emitting units 22b and 22d. The bottom of the notch 50 is composed by the top surface 10a of the substrate 10. The difference between the maximum bottom width of the notch 50 and the minimum bottom width of the trench 36 is less than 20%. In one embodiment, the difference between the maximum bottom width of the notch 50 and the minimum bottom width of the trench 36 is less than 10%. In one embodiment, the difference between the maximum bottom width of the notch 50 and the minimum bottom width of the trench 36 between the light-emitting units 22b and 22d is less than 20%. In one embodiment, the difference between the maximum bottom width of the notch 50 and the minimum bottom width of the trench 36 between the light-emitting units 22b and 22d is less than 10%.

Figure 5:
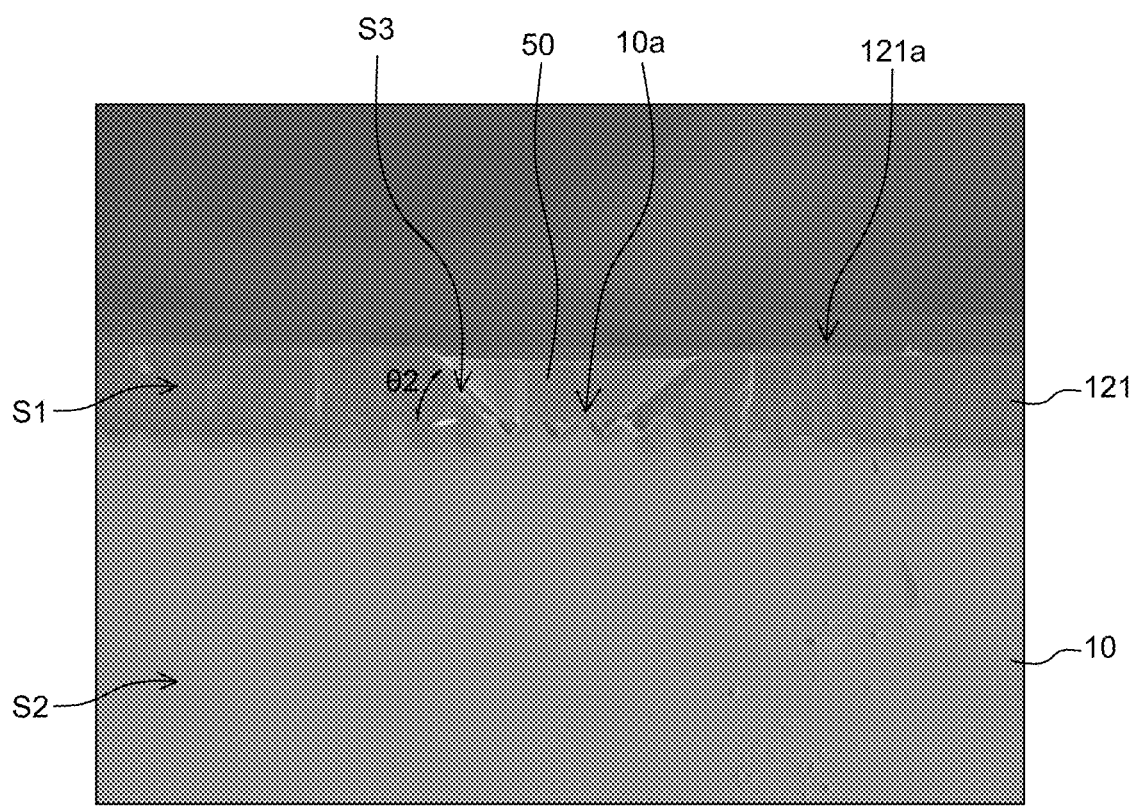
FIG. 5 shows a scanning electron microscope image (SEM) of the light-emitting device 1.

FIG. 5 shows a scanning electron microscope (SEM) image of the side wall of the semiconductor stack 12 and the side wall of the substrate 10 viewed from the X direction shown in FIG. 3. The side wall S3 of the notch 50 is connected to the side wall S1 of the first semiconductor layer 121 of the light-emitting unit 22c. In one embodiment, the notch 50 has a wide top and a narrow bottom. The included angle θ2 between the side wall S3 of the notch 50 and the top surface 10a of the substrate 10 is between 20 degrees and 80 degrees. In one embodiment, a difference between the included angle θ2 between the side wall S3 of the notch 50 and the top surface 10a of the substrate 10 and the included angle θ1 between the side wall of the trench 36 and the top surface 10a of the substrate 10 is less than 20%. In one embodiment, a difference between the included angle θ2 between the side wall S3 of the notch 50 and the top surface 10a of the substrate 10 and the included angle θ1 between the side wall of the trench 36 and the top surface 10a of the substrate 10 is less than 10%.

Figure 6A:
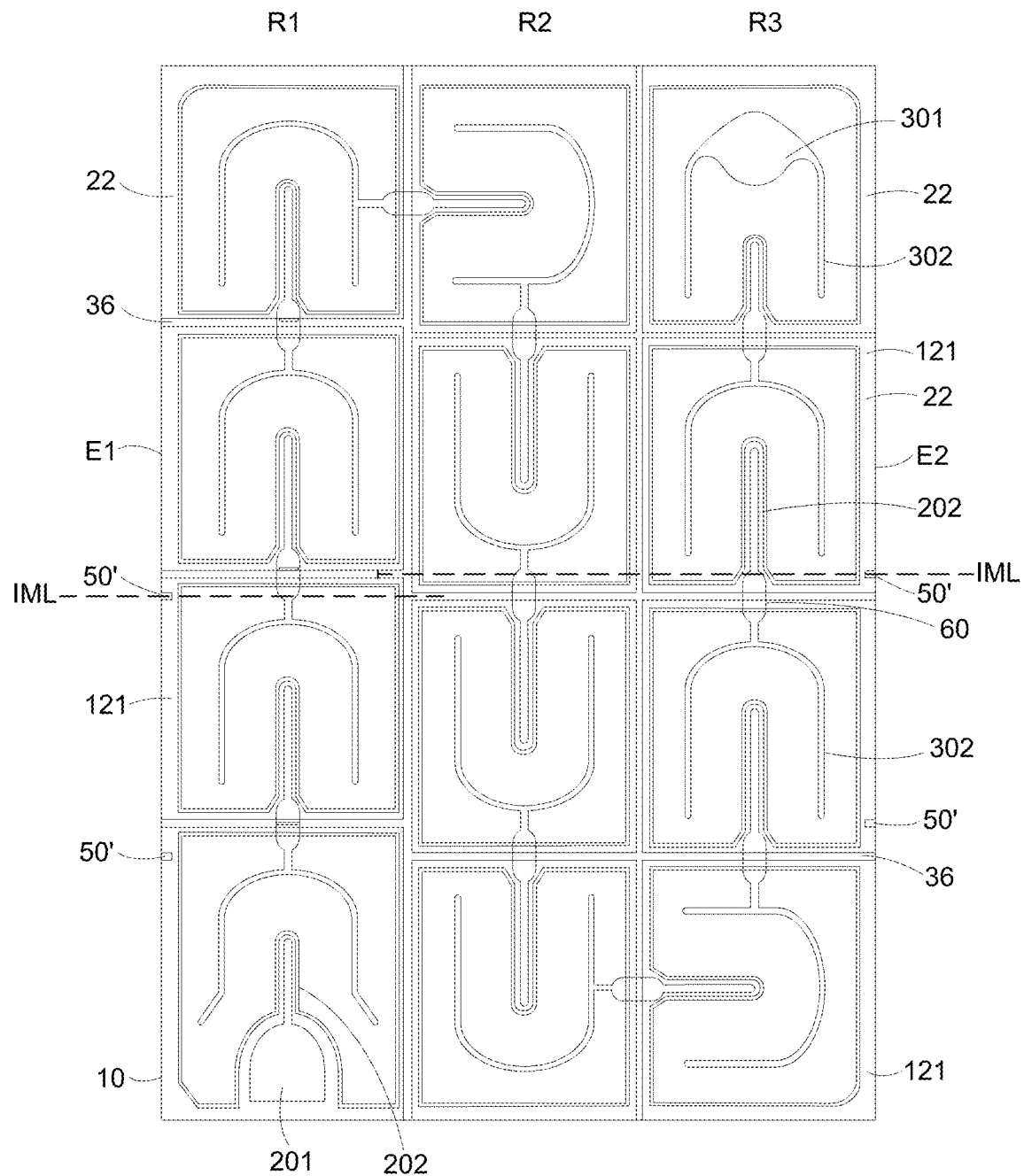
FIG. 6A shows a top view of a light-emitting device 2 in accordance with another embodiment of the present application.
Figure 6B:
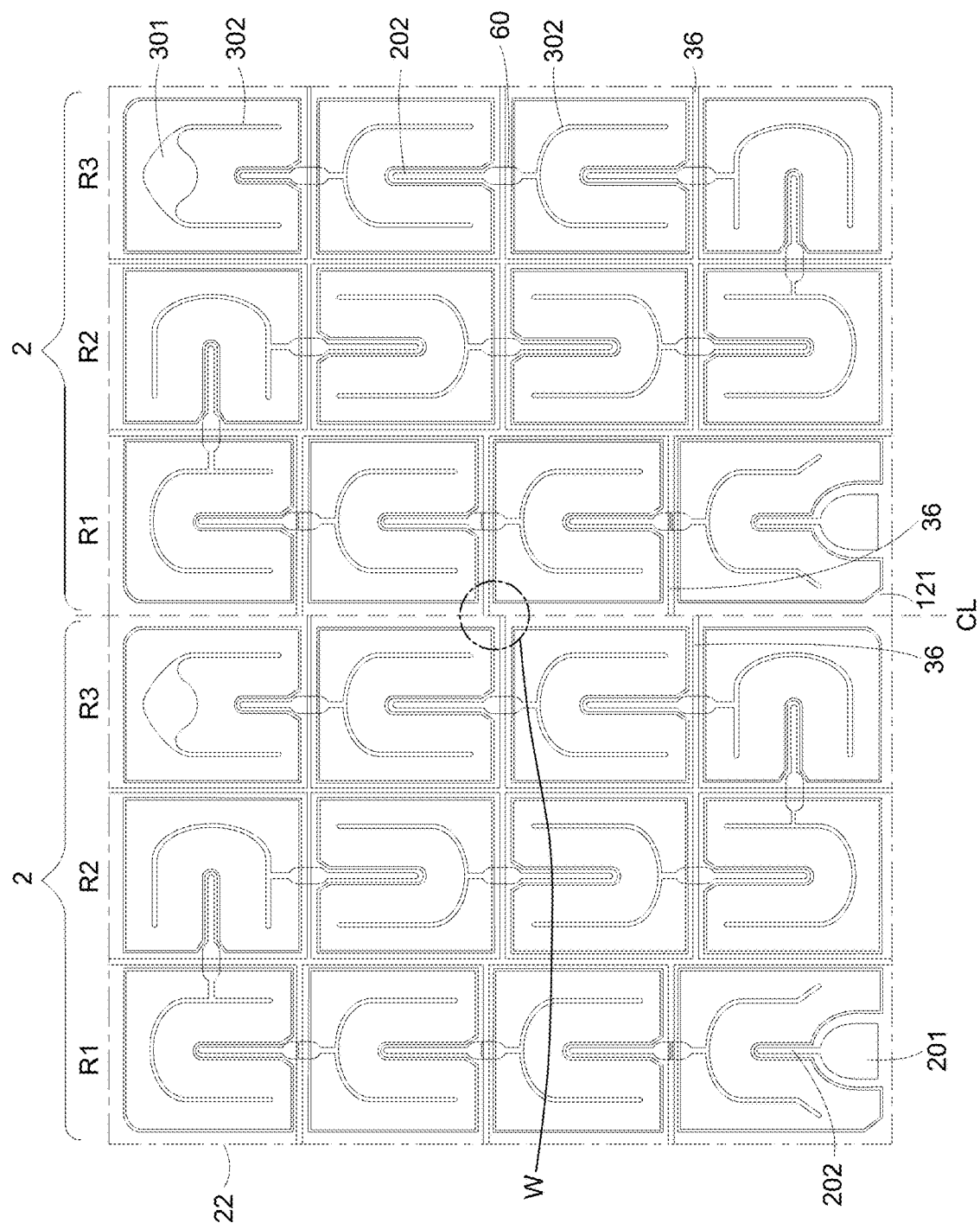
FIG. 6B shows a top view of a manufacturing method of the light-emitting device 2 in accordance with another embodiment of the present.
Figure 6C:
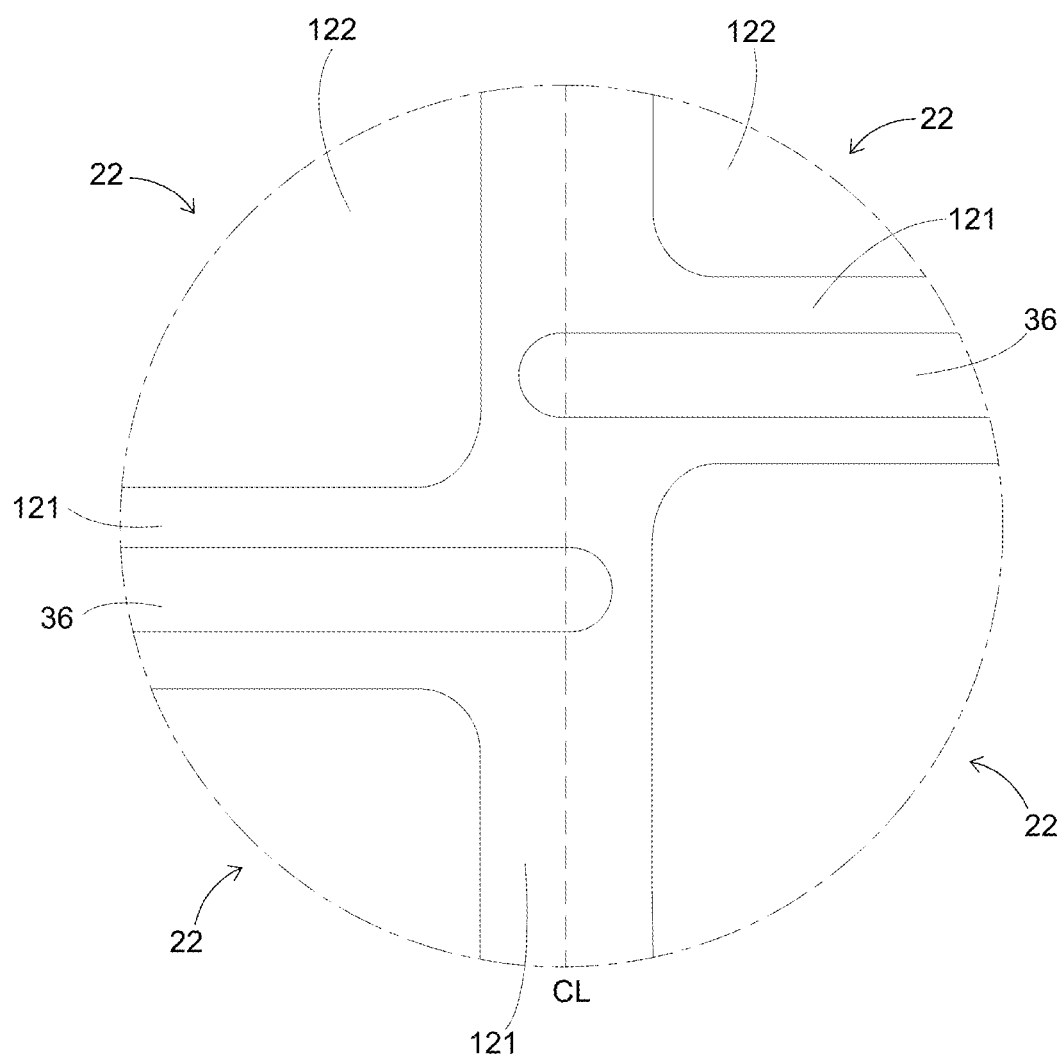
FIG. 6C shows a partial enlarged view of FIG. 6B.

FIG. 6A shows a top view of a light emitting device 2 in accordance with another embodiment of the present application. FIG. 6B shows a partial top view of the semiconductor wafer of the manufacturing method for the light-emitting device 2. FIG. 6C is a partially enlarged view of the area W in FIG. 6B. The light-emitting device 2 is similar to the light-emitting device 1, including a plurality of light-emitting units 22 that are spaced apart on the substrate 10 by the trenches 36. The plurality of light-emitting units 22 is electrically connected to each other by connection electrodes 60 to form a light-emitting unit array. The difference between the light-emitting devices 1 and 2 is that the light-emitting device 2 includes 12 light-emitting units arranged in a 3×4 array or a 4×3 array. In order to clearly show the light-emitting device 2, the current blocking layer and the transparent conductive layer are not shown in FIGS. 6A to 6C. However, people skilled in the art can still understand the structures and the relationships of the light-emitting units 22 in light-emitting device 2 from the description of the above mentioned embodiments.

As shown in FIG. 6A, the area of one of the light-emitting units 22 in the first row R1 and the area of one of the light-emitting unit 22 in the third row R3 are unequal. The light-emitting device 2 is asymmetric since the arrangement of the light-emitting units 22 on the first edge E1 and the arrangement of the light-emitting units 22 on the second edge E1 are different. In other words, the trench 36 between the light-emitting units 22 in the first row R1 and the trench 36 between the light-emitting units 22 in the third row R3 are not all aligned. The light-emitting unit 22 in the first row R1 includes a notch 50' located on the first edge E1 and the light-emitting unit 22 in the third row R3 includes another notch 50' located on the second edge E2. In one embodiment, the manufacturing method for the light-emitting device 2 is similar to that for the light-emitting device 1. As shown in FIG. 6B, the trench 36 is not formed between adjacent light-emitting devices 2 to be used as a pre-defined dicing line. The first semiconductor layer 121 between the adjacent light-emitting devices 2 is left on and kept connected. Then, the first semiconductor layer 121 is separated to form the plurality of light-emitting devices 2 in the subsequent dicing process. In the present embodiment of the manufacturing method for the light-emitting device 2, the trench 36 between the light-emitting units 22 in one light-emitting device 2 extends to the light-emitting unit 22 of the adjacent light-emitting device 2. For example, the trench 36 between the light-emitting units 22 in the third row R3 of the light-emitting device 2 in the semiconductor wafer extends into the first semiconductor layer 121 of the light-emitting units 22 in the first row R1 of the adjacent light-emitting device 2. It can ensure all the light-emitting units 22 can be separately formed on the substrate 10 through the trenches 36 and dicing lines CL in the subsequent dicing process.

In the embodiment shown in FIG. 6A, the first semiconductor layer 121 of the light-emitting unit 22 in the first row R1 includes a notch 50' on the first edge E1, and its position is on an imaginary extending line IML of the trench 36 between the light-emitting units 22 in the third row R3. In one embodiment, the notch 50' is formed by the manufacturing method as described in the abovementioned embodiment. As shown in FIGS. 6B and 6C, in the semiconductor wafer that has not been diced, the trench 36 between the light-emitting units 22 in the third row R3 in the left light-emitting device 2 extends into the first semiconductor layer 121 of the light-emitting unit 22 in the first row R1 of the right light-emitting device 2. The extending trench 36 between the light-emitting units 22 in the third row R3 in the left light-emitting device 2 forms the notch 50' on the first edge E1 of the right light-emitting device 2 after the semiconductor wafer being diced.

In one embodiment, as shown in FIG. 6A, the first semiconducting layer 121 of the light-emitting unit 22 in the third row R3 includes another notch 50' on the second edge E2, and the position of the notch 50' is on an imaginary extending line IML of the trench 36 between the light-emitting units 22 in the first row R1. In one embodiment, the notch 50' is formed in the same manner as described above. As shown in FIGS. 6B and 6C, in the semiconductor wafer that has not been diced, the trench 36 between the light-emitting units 22 in the first row R1 in right the light-emitting device 2 extends into the first semiconductor layer 121 of the light-emitting unit 22 in the third row R3 of the left light-emitting device 2. The extending trench 36 between the light-emitting units 22 in the first row R1 in the right light-emitting device 2 forms the notch 50' on the second edge E2 of the left light-emitting device 2 after the semiconductor wafer being diced. The notch 50' has a similar structure to the notch 50 of the light-emitting device 1 in the above embodiment. The bottom of the notch 50' is the top surface 10a of the substrate. The difference between the maximum bottom width of the notch 50' and the minimum bottom width of the trench 36 is less than 20%. In one embodiment, the difference between the maximum bottom width of the notch 50' and the minimum bottom width of the trench 36 is less than 10%.

In one embodiment, the difference between the maximum bottom width of the notch 50' on the first edge E1 and the minimum bottom width of the trench 36 between the light-emitting units 22 in the third row R3 is less than 20%. In one embodiment, the difference between the maximum bottom width of the notch 50' on the first edge E1 and the minimum bottom width of the trench 36 between the light-emitting units 22 in the third row R3 is less than 10%. In one embodiment, the difference between the maximum bottom width of the notch 50' on the second edge E2 and the minimum bottom width of the trench 36 between the light-emitting units 22 in the first row R1 is less than 20%. In one embodiment, the difference between the maximum bottom width of the notch 50' on the second edge E2 and the minimum bottom width of the trench 36 between the light-emitting units 22 in the third row R1 is less than 10%.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a substrate, comprising a top surface;
   a first edge and a second edge opposite to the first edge;
   a plurality of light-emitting units arranged in N rows on the substrate, wherein the N rows comprises a first row at the first edge and a $N^{th}$ row at the second edge; and
   a plurality of connection electrodes, formed on and electrically connecting the plurality of light-emitting units;
   wherein the plurality of light-emitting units comprises a first light-emitting unit in the first row, and the first light-emitting unit comprises a first notch on the first edge wherein the first notch comprises a bottom composed by the top surface.

2. The light-emitting device according to claim 1, wherein the first light-emitting unit includes a first side wall on the first edge, the substrate includes a second side wall on the first edge; and the first side wall and the second side wall are connected and coplanar.

3. The light-emitting device according to claim 2, wherein the first side wall connects to the first notch.

4. The light-emitting device according to claim 2, wherein the first notch comprises a third side wall; and an included angle between the third side wall and the top surface is smaller than an included angle between the first side wall and the top surface.

5. The light-emitting device according to claim 1, wherein:
the plurality of light-emitting units comprises a second light-emitting unit and a third light-emitting unit in the N$^{th}$ row;
the light-emitting device further comprises a first trench between the second light-emitting unit and the third light-emitting unit and having an imaginary extending line; and
the first notch is located on the imaginary extending line of the first trench.

6. The light-emitting device according to claim 5, wherein the first notch comprises a maximum bottom width, the first trench comprises a minimum bottom width, and a difference between the maximum bottom width and the minimum bottom width is less than 20%.

7. The light-emitting device according to claim 5, wherein the first notch comprises a third side wall and the first trench comprises a fourth side wall; and wherein a difference between an included angle between the third side wall and the top surface and an included angle between the fourth side wall and the top surface is less than 10%.

8. The light-emitting device according to claim 5, wherein the second light-emitting unit comprises a fourth side wall and the substrate includes a fifth side wall on the second edge; wherein the fourth side wall and the fifth side wall are connected and coplanar.

9. The light-emitting device according to claim 5, wherein the first light-emitting unit comprises an area different from that of the second light-emitting unit and that of the third light-emitting unit.

10. The light-emitting device according to claim 5, wherein the first light-emitting unit comprises a shape different from that of the second light-emitting unit and that of the third light-emitting unit.

11. The light-emitting device according to claim 5, wherein the plurality of light-emitting units comprises a first group in the first row and a second group in the N$^{th}$ row, a number of light-emitting units of the second group is different from a number of light-emitting units of the first group.

12. The light-emitting device according to claim 5, wherein the plurality of connection electrodes comprises a first connection electrode electrically connecting the first light-emitting unit and the second light-emitting unit and a second connection electrode electrically connecting the first light-emitting unit and the third light-emitting unit.

13. The light-emitting device according to claim 5, wherein the plurality of connection electrodes comprises a first connection electrode formed on the first trench and electrically connecting the second light-emitting unit and the third light-emitting unit.

14. The light-emitting device according to claim 13, further comprising a current blocking layer between the first connection electrode and the first trench.

15. The light-emitting device according to claim 5, wherein the second light-emitting unit comprises a second notch on the second edge.

16. The light-emitting device according to claim 15, further comprising:
a fourth light-emitting unit in the first row and adjacent to the first light-emitting unit; and
a second trench between the first light-emitting unit and the fourth light-emitting unit;
wherein the second notch is located on an imaginary extending line of the second trench.

17. The light-emitting device according to claim 5, wherein the first trench comprises a bottom composed by the top surface.

18. The light-emitting device according to claim 2, wherein an included angle between the first side wall and the top surface of the substrate is greater than 80 degrees.

19. The light-emitting device according to claim 1, wherein the first light-emitting unit comprises a first semiconductor layer, an active region and a second semiconductor layer sequentially formed on the top surface; and the first notch is in the first semiconductor layer.

20. The light-emitting device according to claim 1, wherein the first notch comprises a third side wall and an included angle between the third side wall and the top surface is between 20 degrees and 80 degrees.

* * * * *